United States Patent
Dmytriw

(10) Patent No.: US 9,804,214 B2
(45) Date of Patent: Oct. 31, 2017

(54) PIEZO KEY SENSING CIRCUIT AND METHOD FOR TESTING THE PIEZO KEY SENSING CIRCUIT

(71) Applicant: DIEHL AKO STIFTUNG & CO. KG, Wangen (DE)

(72) Inventor: Tony Dmytriw, Dekalb, IL (US)

(73) Assignee: Diehl AKO Stiftung & Co. KG, Wangen (DE)

( * ) Notice: Subject to any disclaimer, the term of this patent is extended or adjusted under 35 U.S.C. 154(b) by 168 days.

(21) Appl. No.: 14/700,359

(22) Filed: Apr. 30, 2015

(65) Prior Publication Data
US 2015/0260770 A1  Sep. 17, 2015

Related U.S. Application Data

(63) Continuation of application No. PCT/IB2012/003093, filed on Oct. 31, 2012.

(51) Int. Cl.
*G01R 27/26* (2006.01)
*H03K 17/96* (2006.01)
*G01L 1/16* (2006.01)

(52) U.S. Cl.
CPC .......... *G01R 27/2605* (2013.01); *G01L 1/16* (2013.01); *H03K 17/964* (2013.01)

(58) Field of Classification Search
CPC .... G01L 1/14; G01L 1/16; G01L 1/18; G01R 27/26; G01R 27/2605; G01R 31/016; G01R 31/312; G01R 29/22; G01N 27/007
USPC .......... 324/658, 519, 677, 678, 727
See application file for complete search history.

(56) References Cited

U.S. PATENT DOCUMENTS

| | | | |
|---|---|---|---|
| 3,940,637 A * | 2/1976 | Ohigashi | |
| 4,539,554 A | 9/1985 | Jarvis et al. | |
| 5,136,202 A * | 8/1992 | Carenzo | B65H 59/40 310/319 |
| 5,638,060 A | 6/1997 | Kataoka et al. | |
| 6,522,032 B1 | 2/2003 | Karnowka et al. | |
| 6,556,028 B1 * | 4/2003 | Umanskiy | G01R 29/22 324/727 |
| 6,698,269 B2 * | 3/2004 | Barber | |
| 7,042,228 B2 * | 5/2006 | Lally | G01D 3/08 324/527 |
| 7,857,413 B2 * | 12/2010 | Shamoun | |
| 2008/0236295 A1 | 10/2008 | Hsieh | |

(Continued)

OTHER PUBLICATIONS

Tian Ye et al., "Capacitive touch sensor design based on charging/discharging principle", College of Information and Control Engineering, China University of Petroleum Dongying 257061, China, Electronic Design Engineering, Oct. 2010 www.cnki.com.cn—abstract.

*Primary Examiner* — Walter L Lindsay, Jr.
*Assistant Examiner* — Milton Gonzalez
(74) *Attorney, Agent, or Firm* — Laurence A. Greenberg; Werner H. Stemer; Ralph E. Locher

(57) ABSTRACT

A method tests a piezo key sensing circuit having a piezo element and verifies that it is properly functioning. A capacitance of the piezo element is discharged. Then the capacitance of the piezo element is charged during a predetermined time period. An output signal of the piezo element is measured during the predetermined time period resulting in a measured output signal. An operating condition of the piezo key sensing circuit is determined based on the measured output signal.

20 Claims, 1 Drawing Sheet

(56) References Cited

U.S. PATENT DOCUMENTS

2009/0121724 A1\* 5/2009 Perryman
2009/0146533 A1 6/2009 Leskinen et al.
2014/0320154 A1\* 10/2014 Arunachalam ....... G01L 27/007

\* cited by examiner

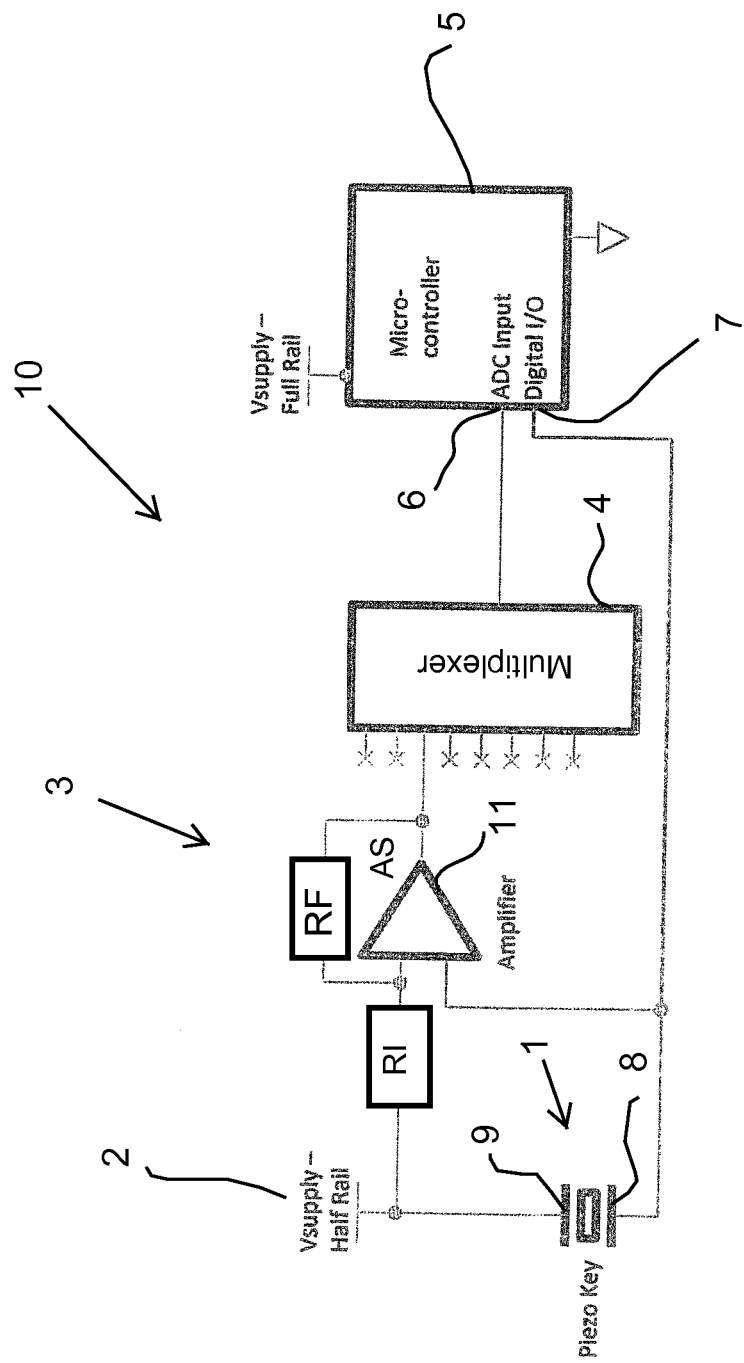

PIEZO KEY SENSING CIRCUIT AND METHOD FOR TESTING THE PIEZO KEY SENSING CIRCUIT

CROSS-REFERENCE TO RELATED APPLICATION

This is a continuation application, under 35 U.S.C. §120, of copending international application No. PCT/IB2012/003093, filed Oct. 31, 2012, which designated the United States.

BACKGROUND OF THE INVENTION

Field of the Invention

The invention relates to a method for testing a piezo key sensing circuit and its related electrical connections and to a piezo key sensing circuit having a built-in diagnostic capability.

Piezo keyboards and keypads for kitchen appliances need to be periodically checked to verify that their electrical connections to a sensing circuit and an electric path between the piezo keys and the sensing circuit function properly. This is important for the ability to make sure that all safety critical user interface keys are functional without having to add additional redundant circuitry to the device.

The piezo keyboard or keypad is based on the principle of the piezoelectric effect. By pressing a piezo key on the keypad, a piezo element or ceramic forming the piezo key generates a voltage pulse. The signal of the voltage pulse is amplified using integrated electronics to a switched output in which the actuation is now recorded. In the unactuated condition, the piezo element is in a high impedance state and the switch has a high resistance such as a resistance greater than 10 M ohms.

In addition, a piezo element exhibits a range of capacitance. There is a need to verify the functionality of the electronics in series with the piezo element and its electrical path to those components namely, for detecting a short circuit condition or an open condition. It is possible to use this capacitance to verify that all the electronics and electrical connections between the piezo element and the sensing microcontroller are present and functioning properly. Ideally, the testing is performed by using as many existing onboard electronic components for the testing circuit rather than adding addition components to perform the testing.

SUMMARY OF THE INVENTION

It is accordingly an object of the invention to provide a piezo key sensing circuit and a method for testing the piezo key sensing circuit which overcome the above-mentioned disadvantages of the prior art methods and devices of this general type, which efficiently tests the piezo key sensing circuit and uses only existing on-board electronic components.

With the foregoing and other objects in view there is provided, in accordance with the invention a method for testing a functionality of a piezo key sensing circuit. The method includes discharging a capacitance of a piezo element. Then the capacitance of the piezo element is allowed to recharge during a predetermined time period. An output signal of the piezo element is measured during the predetermined, repeatable, time period resulting in a measured output signal. An operating condition of the piezo key sensing circuit is determined based on the measured output signal.

The method allows a signal processor to check for a range of capacitance exhibited within a piezo key element by first discharging the capacitance and then measuring a signal during the recharge time following the discharge release. From the signal measured during the charge time, one can determine the state of the piezo key and its associated sensing electronic circuit to determine that it is properly functioning or that it needs repair. In addition, the charging and discharging cycles of the piezo element are easily to perform and are highly reproducible, thus the testing of the piezo element and its sensing circuit is highly accurate.

In accordance with an added mode of the invention, the capacitance of the piezo element is discharged by switching a terminal of the piezo element to a low voltage source such as zero volts. Then the capacitance of the piezo element is charged by switching the same terminal of the piezo element to a high impedance state. The charging and discharging of the capacitance of the piezo element can be performed by connecting a terminal of the piezo element to a digital I/O pin of a microprocessor and toggling a state of the digital I/O pin between a low voltage state (0 V) and a high impedance state.

In accordance with another mode of the invention, the output signal is amplified by an amplifier circuit before it is measured, resulting in an amplified output signal.

In accordance with an additional mode of the invention, the measured output signal determines if the piezo key sensing circuit is exhibiting a state selected from the group consisting of a short circuit state, an open state and a properly functioning state.

Ideally, an analog-to-digital converter within a microcontroller is provided for sensing the measured output signal and determining the operational condition of the piezo element.

In accordance with a further mode of the invention, the amplified output signal is transferred through a multiplexer having an output connected to an analog-to-digital converter pin of the microcontroller.

With the foregoing and other objects in view there is provided, in accordance with the invention a further method for testing a piezo key sensing circuit. The method includes charging a capacitance of a piezo element. Then the capacitance of the piezo element is allowed to discharge during a predetermined time period. An output signal of the piezo element is measured at the predetermined time resulting in a measured output signal. Finally, an operating condition of the piezo key sensing circuit is determined based on the measured output signal.

In accordance with an added mode of the invention, the capacitance of the piezo element is charged by applying a high voltage source (i.e. 5 volts) to a terminal of the piezo element. Then the capacitance of the piezo element is discharged by applying a high impedance state to the terminal of the piezo element. The charging and discharging of the capacitance can be performed by connecting the piezo element to a digital I/O pin of a microprocessor and toggling a state of the digital I/O pin between a digital high voltage state (i.e. 5 volts) and a high impedance state.

With the foregoing and other objects in view there is provided, in accordance with the invention a piezo key sensing circuit. The piezo key sensing circuit contains a microcontroller having a digital I/O pin and an analog-to-digital converter (ADC) pin. An amplifier circuit is provided and has an output coupled to the ADC pin. A piezo element is connected to the digital I/O pin and to the amplifier circuit. The microcontroller is programmed to: discharge a capacitance of the piezo element via the digital I/O pin; charge the capacitance of the piezo element during a predetermined time period via the digital I/O pin; measure an output signal of the piezo element during the predetermined time period resulting in a measured output signal via the ADC pin; and determine an operating condition of the piezo key sensing circuit based on the measured output signal.

Other features which are considered as characteristic for the invention are set forth in the appended claims.

Although the invention is illustrated and described herein as embodied in a piezo key sensing circuit and method for testing the piezo key sensing circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

The single FIGURE of the drawing is a block diagram of a piezo key sensing circuit having built in diagnostic capabilities according to the invention.

DETAILED DESCRIPTION OF THE INVENTION

Referring now to the single FIGURE of the invention in detail, there is shown a piezo key 1 and its sensing circuit 10. The piezo key 1 is formed from a piezo element which has an inherent capacitance associated with it that can be tested for verifying a proper operation of the piezo key 1 and its sensing circuit 10. During normal operation, the piezo key 1 is connected to a voltage source 2, an amplifying circuit 3, a multiplexer 4 and a microprocessor 5 having an analog-to-digital (ADC) converter.

The invention relates to determining the proper functioning of the piezo key 1, the component parts 3, 4, 5 of the piezo key sensing circuit 10 and associated wiring without having to add additional diagnostic circuitry to the piezo key sensing circuit 10. The testing will verify the electrical connections between the components 1, 3, 4, 5 and have the ability to determine at least an open condition, a short circuit condition, or a proper functioning condition of the piezo key sensing circuit 10.

By adding a signal path between one terminal 8 of the piezo key 1 and a digital input/output (I/O) 7 of the microcontroller 5, one has the ability to test for a single point electrical open condition and a signal point electrical short condition within the measuring signal path between the piezo key 1 and the microcontroller 5. Therefore self-diagnostic capabilities of the piezo key's 1 sensing ability are now possible and more specifically the signals of piezo key 1 can now be sensed.

In order to test the piezo key sensing circuit 10, the digital I/O pin 7 of the microcontroller 5 is set to a high impedance state. This setting allows a capacitance within the piezo key 1 to charge appropriately. During a subsequent diagnostic test sequence, the microcontroller 5 sets the digital I/O pin 7 to an output state at a known voltage level. For example, a low voltage level is present at the digital I/O pin 7. Due to the low voltage level, the capacitance of the piezo key discharges. Once the capacitance is discharged, the microcontroller 5 can then be reset by putting the digital I/O pin 7 to a high impedance state. An output signal from the piezo key 1 is amplified via the amplifier circuit 3, which is connected to another terminal 9 of the piezo key 1, and has an amplifier 11, a feedback resistor RF and a control resistor RI. The amplifier circuit 3 outputs an amplified output signal AS to the multiplexer 4. The amplified output signal AS being an analog signal is forwarded to the analog-to-digital converter input pin 6 of the microcontroller 5 for sensing a change in voltage. A known time constant for the piezo key's capacitance allows the signal to recharge at a known rate. Therefore, a measured analog-to-digital (ADC) signal value is tested and compared to given limits as the piezo key 1 recharges. As this is an easy to perform test sequence, the test is highly repeatable where the ADC signal is measured during a given time period depending on a state of the digital I/O pin 7.

Conversely, the digital I/O pin 7 could have been set to a high voltage level (e.g. Vsupply full rail (i.e. 5 volts) and the piezo key 1 would charge up rather than discharge at a constant time rate. After the piezo key 1 has charged, the digital I/O pin 7 is set to a high impedance state. At this point the capacitance will discharge at a known rate. Once again the output signal of the amplifier is tested to see if it is within given limits.

If during the diagnostic test sequence, the ADC measured value is not within known limits, the microcontroller 5 can determine that the piezo key sensing circuit 10 is defective. More specifically, if a short circuit condition or an open condition were to exist, the signal detected by the microcontroller 5 would not toggle its state during a known time frame.

In summary, the invention uses the properties of the capacitance of the piezo key 1 to verify the functioning of the piezo key sensing circuit 10 and its related wiring. The testing is performed using a previously unused digital I/O pin 7 of the microprocessor 5 or by an additional use of the digital I/O pin 7. Therefore the testing can be done by software and the addition of one more wire trace between the terminal 8 of the piezo key 1 and the digital I/O pin 7 of the microprocessor 5.

The piezo key 1 is a part of a household appliance such as a refrigerator, freezer, washing machine, dryer, dish washing machine, oven, stove, cook top, etc. and this simple testing verifies that critical operating components of the household appliance are functioning. For example, the on/off button of an oven.

The invention claimed is:
1. A method for testing a functionality of a piezo key sensing circuit, which comprises the steps of:
    discharging a capacitance via a first terminal of a piezo element;
    charging the capacitance via the first terminal of the piezo element during a predetermined time period, the charging of the capacitance of the piezo element being initiated by applying a high impedance state to the first terminal of the piezo element;
    measuring an output signal of the piezo element during the predetermined time period resulting in a measured output signal; and
    determining an operating condition of the piezo key sensing circuit based on the measured output signal.

2. The method according to claim 1, which further comprises discharging the capacitance of the piezo element by applying a low voltage source to the first terminal of the piezo element.

3. The method according to claim 1, which further comprises connecting the first terminal of the piezo element to a digital I/O pin of a microprocessor and toggling a state of the digital I/O pin between a low voltage state and a high impedance state.

4. The method according to claim 3, which further comprises amplifying the output signal via an amplifier circuit before the output signal is measured, resulting in an amplified output signal.

5. The method according to claim 4, which further comprises forwarding the amplified output signal to a multiplexer having an output connected to an analog-to-digital converter pin of the microprocessor.

6. The method according to claim 1, which further comprises determining from the measured output signal that the piezo key sensing circuit is exhibiting a state selected from the group consisting of a short circuit state, an open state and a properly functioning state.

7. The method according to claim 1, which further comprises providing a microcontroller for sensing the measured output signal for determining the operational condition of the piezo key sensing circuit.

8. A method for testing a piezo key sensing circuit, which comprises the steps of:
    charging a capacitance of a piezo element via a first terminal;
    discharging the capacitance of the piezo element at the first terminal during a predetermined time period, the discharging of the capacitance of the piezo element being initiated by applying a high impedance state to the first terminal of the piezo element;
    measuring an output signal of the piezo element during the predetermined time period resulting in a measured output signal; and
    determining an operating condition of the piezo key sensing circuit based on the measured output signal.

9. The method according to claim 8, which further comprises charging the capacitance of the piezo element by applying a high voltage source to the first terminal of the piezo element.

10. The method according to claim 8, which further comprises connecting the piezo element to a digital I/O pin of a microprocessor and toggling a state of the digital I/O pin between a high voltage state and a high impedance state.

11. The method according to claim 10, which further comprises amplifying the output signal via an amplifier circuit before the output signal is measured, resulting in an amplified output signal.

12. The method according to claim 11, which further comprises forwarding the amplified output signal to a multiplexer having an output connected to an analog-to-digital converter pin of the microprocessor.

13. The method according to claim 8, which further comprises determining from the measured output signal that the piezo key sensing circuit is exhibiting a state selected from the group consisting of a short circuit state, an open state, and a properly functioning state.

14. The method according to claim 8, which further comprises providing a microcontroller for sensing the measured output signal and determining the operational condition of the piezo key sensing circuit.

15. A piezo key sensing circuit, comprising:
    a microcontroller having a digital I/O pin and an analog-to-digital converter (ADC) pin;
    an amplifier circuit having an output coupled to said ADC pin;
    a piezo element connected directly to said digital I/O pin and to said amplifier circuit;
    said microcontroller programmed to:
        discharge a capacitance of said piezo element via said digital I/O pin;
        charge the capacitance of said piezo element during a predetermined time period via said digital I/O pin, a charging of the capacitance of said piezo element being initiated by applying a high impedance state to said digital I/O pin;
        measure an output signal of said piezo element during the predetermined time period resulting in a measured output signal via said ADC pin; and
        determine an operating condition of the piezo key sensing circuit based on the measured output signal.

16. The piezo key sensing circuit according to claim 15, wherein said microcontroller is programmed to toggle a state of said digital I/O pin between a low voltage state and a high impedance state.

17. The piezo key sensing circuit according to claim 15, wherein said microcontroller is programmed to determine from the measured output signal that the piezo key sensing circuit is exhibiting a state selected from the group consisting of a short circuit state, an open state, and a properly functioning state.

18. A piezo key sensing circuit, comprising:
    a microcontroller having a digital I/O pin and an analog-to-digital converting (ADC) pin;
    an amplifier circuit having an output coupled to said ADC pin;
    a piezo element connected directly to said digital I/O pin and to said amplifier circuit;
    said microcontroller programmed to:
        charge a capacitance of said piezo element;
        discharge the capacitance of said piezo element during a predetermined time period, a discharging of the capacitance of said piezo element being initiated by applying a high impedance state to said digital I/O pin;
        measure an output signal of said piezo element during the predetermined time period resulting in a measured output signal; and
        determine an operating condition of the piezo key sensing circuit based on the measured output signal.

19. The piezo key sensing circuit according to claim 18, wherein said microcontroller is programmed to toggle a state of said digital I/O pin between a high voltage state and a high impedance state.

20. The piezo key sensing circuit according to claim 18, wherein said microcontroller is programmed to determine from the measured output signal that the piezo key sensing circuit is exhibiting a state selected from the group consisting of a short circuit state, an open state, and a properly functioning state.

\* \* \* \* \*